(12) United States Patent
Kimber et al.

(10) Patent No.: US 7,071,533 B1
(45) Date of Patent: Jul. 4, 2006

(54) BIPOLAR JUNCTION TRANSISTOR ANTIFUSE

(75) Inventors: Kurt N. Kimber, Minneapolis, MN (US); David D. Litfin, Houlton, WI (US); Joseph Burkhardt, Minneapolis, MN (US); Steven L. Kosier, Lakeville, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 0 days.

(21) Appl. No.: 11/051,396

(22) Filed: Feb. 4, 2005

(51) Int. Cl.
*H01L 29/00* (2006.01)
(52) U.S. Cl. ........................ 257/529; 257/565
(58) Field of Classification Search ................ 257/530, 257/529, 565; 438/131, 467, 600
See application file for complete search history.

(56) References Cited

U.S. PATENT DOCUMENTS

| 5,257,222 | A | | 10/1993 | Lee |
| 5,282,158 | A | | 1/1994 | Lee |
| 5,298,784 | A | * | 3/1994 | Gambino et al. ............ 257/529 |
| 5,672,994 | A | | 9/1997 | Au et al. |
| 5,834,813 | A | | 11/1998 | Ma et al. |
| 5,920,771 | A | * | 7/1999 | Appelman et al. ........... 438/131 |
| 6,218,722 | B1 | * | 4/2001 | Cervin-Lawry et al. ..... 257/530 |
| 6,229,733 | B1 | | 5/2001 | Male |
| 6,288,437 | B1 | * | 9/2001 | Forbes et al. ................ 257/530 |
| 6,534,834 | B1 | | 3/2003 | Ashton et al. |
| 6,611,028 | B1 | | 8/2003 | Cheng et al. |
| 6,674,667 | B1 | * | 1/2004 | Forbes .................. 365/185.24 |
| 6,724,592 | B1 | | 4/2004 | Tong et al. |
| 6,897,543 | B1 | * | 5/2005 | Huang et al. ................ 257/530 |
| 2004/0114433 | A1 | | 6/2004 | Forbes |

* cited by examiner

*Primary Examiner*—Sara Crane
(74) *Attorney, Agent, or Firm*—Kinney&Lange, PA (57) ABSTRACT

An antifuse device is constructed from a bipolar junction transistor (BJT). The BJT includes a collector, a base, and an emitter. In one embodiment the BJT is formed inherently within a field effect transistor (FET), including a first doped region, a second doped region, a gate, and a body region. The collector of the BJT is realized by the first doped region of the FET, the emitter of the BJT is realized by the second doped region of the FET, and the base of the BJT is realized by the body region. A high resistance path exists between the collector and the base. A first input voltage is connected to the collector and a second input voltage is connected to the base. A switch connects the emitter to a fixed potential when the switch is closed. The antifuse device is programmed by closing the switch and allowing the first input voltage and the second input voltage to create a large current from the collector to the emitter, through the base, such that the high resistance path between the collector and the base is converted to a permanent low resistance path.

19 Claims, 6 Drawing Sheets

BIPOLAR JUNCTION TRANSISTOR ANTIFUSE

BACKGROUND OF THE INVENTION

This invention relates to a device and method for implementing an antifuse device with a bipolar junction transistor (BJT).

In order to realize long term storage of digital information it is desirable to have a device that can be programmed into one of two states in a permanent, non-volatile manner. The two states of the device should be easily discernable. Such a device can readily represent one bit of information. Typically, permanent programming requires that a device retain the programmed value for an extended amount of time once programmed. For a device to be non-volatile, the device is required to retain the programmed value even after a power source is removed from the device.

A number of different types of devices are capable of implementing applications requiring permanent, non-volatile programming. One such device is an antifuse. A typical antifuse device as known in the prior art is a two terminal device. The antifuse's initial unprogrammed state is high impedance (a working approximation of an "open" circuit) while the antifuse's programmed state is low impedance (a working approximation of a "short" circuit). This is in contrast to the well-known fuse where the initial unprogrammed state is low impedance and the programmed state is high impedance. This contrast in behavior is the rationale behind the name "antifuse".

As stated above, the antifuse is a non-volatile memory element. One particular application of non-volatile memory elements is in read-only memory (ROM). Many applications make use of ROM because of its ability to retain programmed data patterns after power has been removed, in contrast with most random access memory (RAM) systems, which require power to retain programmed data patterns. ROM is therefore known as non-volatile memory. A number of different classes of non-volatile memory are available. Some are programmed by the manufacturer and cannot be changed, others allow a user to program the device only once, and still others allow the memory to be programmed a number of times by a user. Non-volatile memory devices that can only be programmed once are known as one time programmable (OTP) devices. An example of an OTP device is a programmable ROM (PROM) device which allows a user to program the memory one time only. Antifuse devices are therefore well suited for use in OTP devices such as PROMs.

Antifuses are also used in conjunction with other devices to effectively remove offsets from certain outputs of electrical circuits, a practice known as "trimming". Those skilled in the art of circuit design are be familiar with the concept of trimming, which involves fine tuning a particular parameter(s) of a device so as to compensate for random variation of that parameter. Adjusting a voltage reference's output voltage to a precise value is a typical example of trimming.

An antifuse device is a normally high resistance element that is programmed to a low resistance by applying a sufficiently large voltage, known as the programming voltage, such that the impedance between the first terminal and the second terminal is substantially reduced, resulting in a permanent low resistance path between the two terminals. This change in resistance cannot be reversed, which makes antifuses useful in applications in which the programmed data pattern will be permanent, i.e., non-volatile.

The programming voltage of a typical antifuse as known in the prior art requires a sufficiently high voltage level in order to program the antifuse. Typically, the programming voltage is much higher than the logic level voltages used in most circuits. A typical programming voltage required to program an antifuse device known in the prior art is greater than 10 volts. The high voltage required by the antifuse device requires a circuit designer to make modifications to the other circuits on an integrated circuit, to ensure they can withstand voltages of greater than 10 volts without being damaged. High voltage circuit design often requires special high voltage devices and additional resources to implement. Thus, it is desirable to create an antifuse which does not require high voltage levels to program.

BRIEF SUMMARY OF THE INVENTION

The present invention relates to an antifuse device utilizing a bipolar junction transistor (BJT). The BJT is comprised of a collector, a base, and an emitter. The BJT may be formed inherently within a field effect transistor (FET), having a drain, source, gate and body. In this embodiment, the collector of the BJT is realized by the drain of the FET, the emitter of the BJT is realized by the source of the FET, and the base of the BJT is realized by the body of the FET. The FET's gate is shorted to its source or connected to a fixed potential lower than the source to disable any FET conduction in the antifuse. A first input voltage is connected to the collector. A second input voltage is connected to the base. A switch is located between the emitter and a fixed potential sufficiently lower than the first and second voltages, such as ground. The antifuse is programmed by closing the switch, allowing the first input voltage and second input voltage to generate a current flow into the collector. The first input voltage and second input voltage are selected such that the power generated by the current is greater than can be safely dissipated within the BJT, resulting in the fusing of the collector to the base (and to the emitter in some embodiments), which creates a permanent low resistance path between the collector and the base (and between the collector and emitter in some embodiments).

DETAILED DESCRIPTION

Figure 1A:
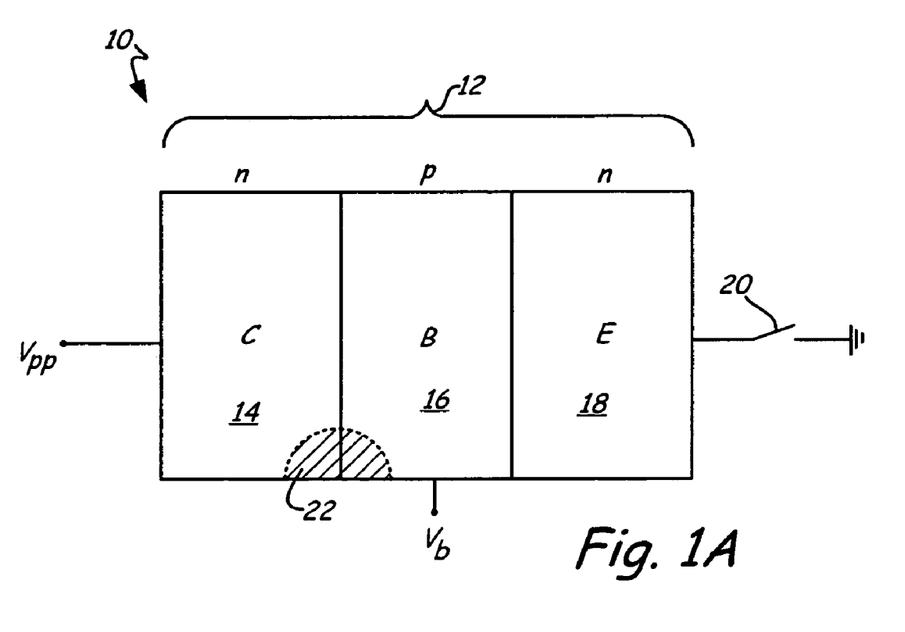
FIG. 1A is a simplified view of a first embodiment of an antifuse device of the present invention, utilizing a bipolar junction transistor (BJT) to create a low resistance path between the base and the collector.

FIG. 1A is a simplified view of antifuse 10 according to an embodiment of the present invention, constructed with bipolar junction transistor (BJT) 12. There are a number of ways to manufacture BJT 12 which are known in the art, but the simplified view of BJT 12 shown in FIG. 1A is sufficient for purposes of discussing the operation of antifuse 10. A person of ordinary skill in the art would recognize that BJT 12 could be either a vertical or lateral transistor. BJT 12 includes two pn junctions connected in series, and placed back to back. BJT 12 has three semiconductor regions: collector (n-type) 14, base (p-type) 16, and emitter (n-type) 18. BJT 12 is therefore called an npn transistor. Although a person of ordinary skill in the art would recognize that a pnp transistor could be used, an npn transistor is preferred for several reasons, one of which is the higher mobility of electrons as compared with holes. Collector 14 is connected to programming voltage Vpp. Base 16 is connected to base voltage Vb. Emitter 18 is connected through switch 20 to ground, although in other embodiments emitter 18 may be connected through switch 20 to a fixed potential sufficiently lower than Vpp and Vb. In order to simplify the following discussions, switch 20 will be described as being between emitter 18 and ground, although some other fixed potential sufficiently lower than Vpp and Vb may be used instead. A person of ordinary skill in the art would a recognize that switch 20 could be moved from between emitter 18 and ground to between Vpp and collector 14 without materially affecting the programming of the antifuse. In order to simplify following discussions, switch 20 will be described as being between emitter 18 and ground while realizing the switch position can always be moved to be between Vpp and collector 14.

BJT 12 has two pn junctions, the emitter-base junction and the collector-base junction. A reverse biased junction creates a very high resistance path. Thus, prior to programming, the collector-base junction represents a high resistance path when it is reversed biased. For the same reason, the path between collector 14 and emitter 18, through base 16, is a high resistance path when the base-collector junction is reversed biased.

In one embodiment, programming antifuse 10 creates a low resistance path between collector 14 and base 16, as represented by region 22 in FIG. 1A. In another embodiment shown in FIG. 1B, programming antifuse 10 creates a low resistance path that connects collector 14, base 16 and emitter 18 as represented by region 24.

Figure 1B:
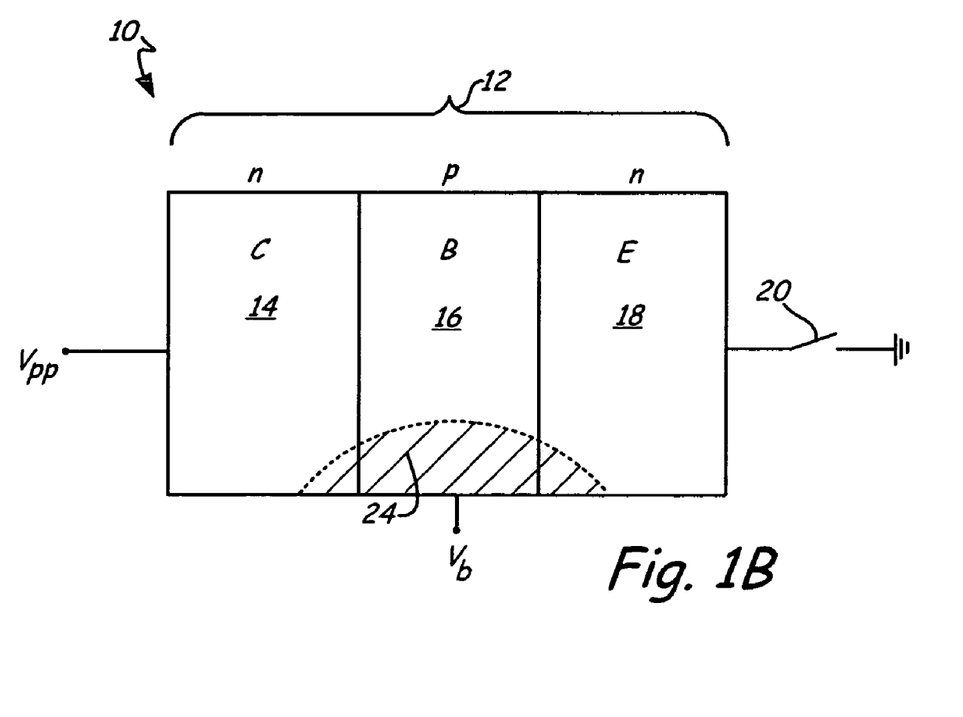
FIG. 1B is a simplified view of the first embodiment of the antifuse device of the present invention, utilizing a BJT to create a low resistance path between the collector and the emitter.

To illustrate the programming of antifuse 10, an exemplary embodiment of the present invention is discussed, although the invention is not limited to the specific values presented. Programming voltage Vpp is assigned a value of approximately 9 volts, and is applied to collector 14. Base voltage Vb is assigned a value sufficient to put BJT 12 into the forward active mode when switch 20 is closed (e.g. approximately 2 volts), and is applied to base 16. BJT 12 operating in forward active mode means the base-emitter junction is forward biased and the base-collector junction is reverse biased. Programming of antifuse 10 starts with the closing of switch 20. When switch 20 closes, BJT 12 operates in the forward active mode. The collector-base junction is reverse biased, because collector 14 is at a greater voltage (9 volts) than base 16 (2 volts). The emitter-base junction is forward biased, because base 16 is at a greater voltage (2 volts) than emitter 18 (pulled towards ground). The programming voltage Vpp applied to collector 14, in conjunction with base voltage Vb and switch 20 connecting emitter 18 to ground, causes a large amount of current to flow from collector 14 to emitter 18. The combination of programming voltage Vpp and base voltage Vb when switch 20 is closed leads to sufficiently high power generation within BJT 12 such that collector 14 is fused to base 16, as shown by shaded region 22. The fusing of collector 14 and base 16 permanently destroys the collector-base junction. By changing the construction of the antifuse and/or changing the programming voltages and duration, it is possible to also realize a low resistance path between collector 14, base 16 and emitter 18 (as shown in FIG. 1B), providing further flexibility in how antifuse 10 is used. This destructive phenomenon is avoided in the typical operation of BJTs. However, the present invention makes use of this destructive phenomenon to create a low resistance path where a previously high resistance path existed. The destructive phenomena involved may be avalanche or thermal runaway followed by secondary breakdown; these phenomena are documented in many college level device physics textbooks (e.g., *Physics of Semiconductor Devices*, by S. M. Sze, John Wiley and Sons). After programming is complete, switch 20 is opened, and programming voltage Vpp and base voltage Vb are removed.

The embodiment discussed above includes a number of variables that can be modified to achieve antifuse programming characteristics suited to a particular application. These variables includes the amount of time switch 20 is left in the closed position, the voltage level of base voltage Vb, and the voltage level of programming voltage Vpp. The sequence in which the various switches are closed and/or opened may be altered while still realizing the desired programming of the antifuse.

In one exemplary embodiment, the amount of time switch 20 is maintained in the closed position is varied. In one example, switch 20 is maintained in the closed position for a period of about 20 microseconds, with programming voltage Vpp set at 9 volts, and base voltage Vb set at 2 volts. The resulting low resistance path between collector 14 and base 16 is measured to be approximately 850 ohms. By allowing switch 20 to remain in the closed position for a longer period of time, the resistance of the low resistance path between collector 14 and base 16 can be reduced. Alternatively, in another example, the amount of time switch 20 is maintained in the closed position is less than 1 microsecond. Each of these variables is interrelated. Thus, a higher programming voltage Vpp will result in faster programming at a lower resistance. A higher base voltage Vb may result in lower programming voltage Vpp requirements. Increasing the amount of time in which switch 20 is left in the closed position will result in a lower resistance path, conversely, decreasing the amount of time in which switch 20 is left in the closed position will result in a higher resistance path. In one embodiment in which the switch is closed for a longer period of time, the low resistance path has a resistance of approximately 50 ohms. In another embodiment in which the switch is closed for a shorter amount of time, the low resistance path has a resistance in the mega ohm region. Furthermore, as shown in FIG. 1B, the terminals between which a low resistance path is created can be altered by varying programming voltage Vpp, base voltage Vb, and programming time.

FIG. 1B is a simplified view of another exemplary embodiment of antifuse 10 device of the present invention, utilizing BJT 12 to create a low resistance path between the collector 14, base 16 and the emitter 18, rather than just between collector 14 and base 16. In essence, the low resistance path created between collector 14 and base 16 and discussed with respect to FIG. 1A is extended by varying programming voltage Vpp, base voltage Vb or programming time such that the low resistance path extends between the collector 14, base 16 and the emitter 18 as shown in FIG. 1B. The principles and phenomena discussed above are involved in this embodiment as well. The low resistance path between collector 14, base 16 and emitter 18 is formed by applying programming voltage Vpp to collector 14, applying base voltage Vb to base 16, and then closing switch 20, effectively pulling emitter 18 to ground. As in the embodiments above, programming voltage Vpp and base voltage Vb can be varied depending on the particular application or result desired. BJT 12 is still operated in the forward active mode, meaning the collector-base junction is reverse biased, and the emitter-base junction is forward biased. Eventually, the high power generated within BJT 12 will cause silicon to melt, fusing collector 14, base 16 and emitter 18, resulting in a low resistance path between collector 14 and emitter 18. The benefit of this embodiment is that a low resistance path is created between collector 14 and base 16 (as shown in FIG. 1A as well), as well as between collector 14, emitter 18, and base 16, providing further flexibility in how antifuse 10 is used.

Figure 2:
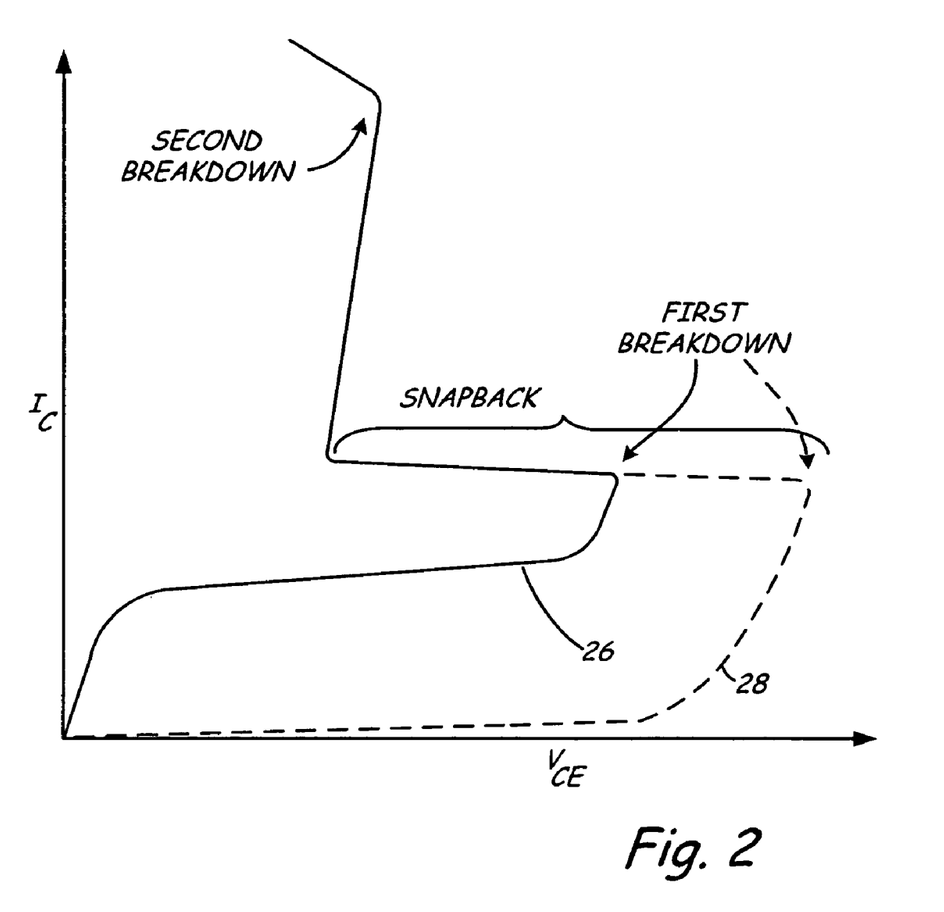
FIG. 2 is a plot of collector current versus collector-emitter voltage of the BJT.

FIG. 2 is a plot of collector current versus collector-emitter voltage of the BJT, illustrating the benefit of applying base voltage Vb to base 16. On the horizontal axis of the plot is collector to emitter voltage Vce. In the embodiments shown in FIGS. 1A and 1B, emitter 18 is pulled to ground through switch 20, while programming voltage Vpp is applied to collector 14 and base voltage Vb is applied to base 16. Therefore, the collector-emitter voltage Vce is essentially equal to programming voltage Vpp, assuming negligible voltage drop across switch 20. The plot shown in FIG. 2 illustrates the current flowing into collector 14 as programming voltage Vpp is increased. In order to program antifuse 10, current through collector 14 must be sufficiently high to fuse collector 14 with base 16 and possibly emitter 18. In the plot shown, the collector current must be increased into the region labeled "Second Breakdown" for this to occur. To reach second breakdown, voltage must be applied to BJT 12 such that BJT 12 passes through the "First Breakdown" point and enters "Snapback," as labeled in FIG. 2. Solid line 26 illustrates the reduction of programming voltage magnitude required to place BJT 12 into snapback mode with assistance of base voltage Vb, as discussed above with respect to the exemplary embodiments of the current invention shown in FIGS. 1A and 1B. Dashed line 28 illustrates the programming voltage required to program BJT if the base voltage Vb is placed at the same potential as emitter 18 (i.e., Vb=0). As shown, by manipulating base 16 with base voltage Vb, the programming voltage Vpp required for BJT 12 to reach snapback is greatly reduced.

Figure 3:
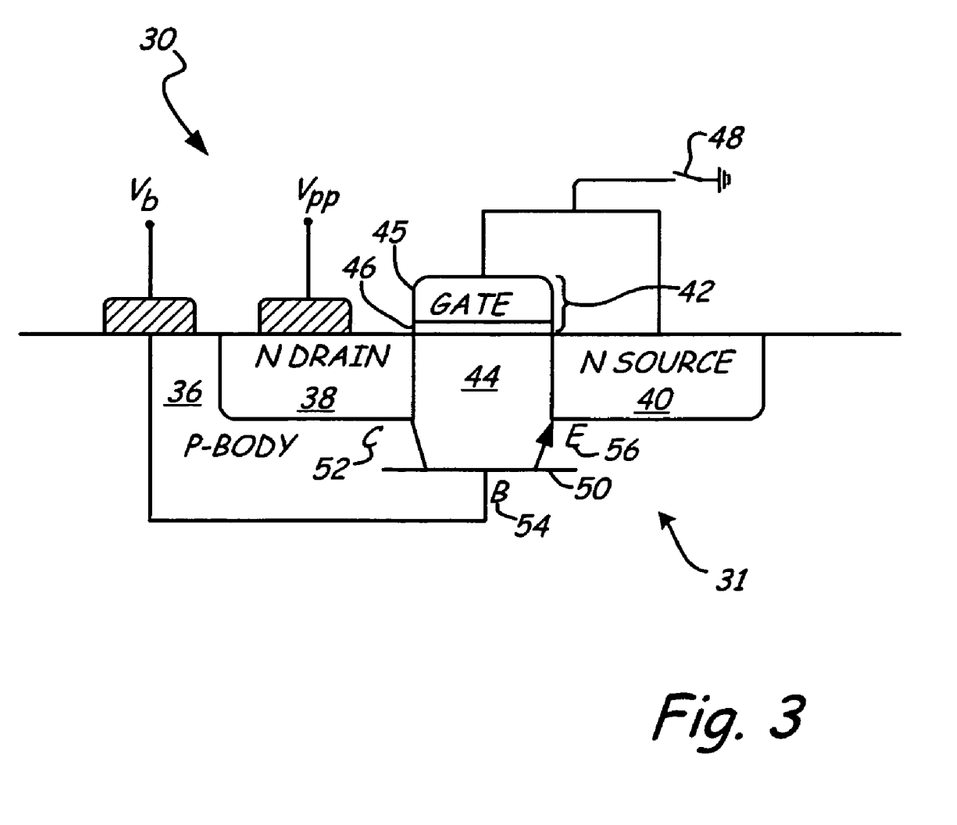
FIG. 3 is a cross-sectional view of another embodiment of an antifuse device of the present invention, showing the BJT inherent in a field effect transistor (FET).

FIG. 3 is a cross-sectional view of a further exemplary embodiment of antifuse 30 of the present invention, utilizing field effect transistor (FET) 31 to implement antifuse 30. FET 31 includes body 36, drain 38, source 40, and gate 42. Drain 38 and source 40 are diffused into body 36 and are separated by channel 44 within body 36. Gate 42 is deposited over channel 44 and includes polysilicon gate 45 and insulating oxide 46. In one embodiment, FET 31 is constructed on a substrate that serves as body 36. In another embodiment, FET 31 is double-tubbed, in which body 36 is implemented by a first tubbed region (not shown), and is separated from a substrate by a second tubbed region (not shown). The benefit of the double tubbed FET is it offers insulation between body 36 and the substrate during programming of antifuse 30 in which large currents are dissipated through body 36. Although FET 31 as shown in FIG. 3 is a NMOS type FET, a person of skill in the art will recognize that a PMOS type FET could also be used, although NMOS is preferable because the inherent BJT is an npn. In the embodiment illustrated in FIG. 3, gate 42 is electrically shorted to source 40, ensuring that gate 42 and source 40 are held at the same potential level, effectively preventing FET 31 from operating in the typical FET fashion. In other embodiments, gate 42 is connected to a fixed potential lower than the potential connected to source 40, such that FET 31 is prevented from operating in the typical FET fashion. That is, in typical FET operation, a voltage applied to the gate of the FET results in a conductive channel forming between a drain and a source, allowing current to flow between the drain and the source with relatively low resistance as long as the conductive channel is maintained by the gate voltage. By shorting gate 42 to source 40, gate 42 is prevented from creating a conductive channel between source 40 and drain 38. A person of ordinary skill in the art would recognize that the gate terminal may be manipulated in a manner to cause typical FET (i.e., source to drain) conduction during the antifuse programming operation without materially impacting the programming of the antifuse. However, in order to have the antifuse represent its high resistance, unprogrammed state, the typical FET conduction must be disabled as described above. In order to simplify following discussions, typical FET conduction will be described as always being disabled while realizing the typical FET conduction may be enabled during the antifuse programming operation. Switch 48 is located between the electrically shorted gate 42 and source 40, and ground. Switch 48 is closed when antifuse 30 is to be programmed. Programming voltage Vpp is connected to drain 38. Voltage Vb is connected to tub 34 to work in conjunction with programming voltage Vpp during the programming of antifuse 30.

Inherent within FET 31 is parasitic lateral bipolar junction transistor (BJT) 50, shown schematically within tub 34. Because FET 31 is effectively turned off by shorting gate 42 to source 40, the operation of antifuse 30 is more easily understood by describing the function of BJT 50. BJT 50 utilizes drain 38 as collector 52, body 36 as base 54, and source 40 as emitter 56. Thus, drain 38 and collector 52 represent the same physical area, and the terms can be used interchangeably. Body 36 operates as base 54, and the terms can be used interchangeably. Likewise, source 40 and emitter 56 represent the same physical area, and the terms can be used interchangeably. Although it would be obvious to a person of skill in the art that if a PMOS type FET were used instead of a NMOS type, a parasitic lateral pnp BJT would be created instead of npn BJT 50. However, a NMOS type FET is preferred in this embodiment due to the higher mobility of majority carriers in a NMOS type FET as compared with the majority carriers of a PMOS type FET.

With FET 31 effectively turned off in this embodiment, there is no conductive channel between drain 38 and source 40. Without a conductive channel, there is a very high resistance between drain 38 and source 40. Furthermore, as discussed above with respect to FIGS. 1A and 1B, BJT 50 has high resistance paths between collector 52 and base 54, as well as between collector 52 and emitter 56 when the junctions are reverse biased. In this state, antifuse 30 is unprogrammed. An antifuse in the unprogrammed state will have a high resistance, and in the programmed state a low resistance. Therefore, in order to program antifuse 30, a permanent low resistance path must be formed between collector 52 and base 54, and possibly between collector 52, base 54 and emitter 56. As discussed in more detail below, this is accomplished by applying a voltage to both drain 38 and body 36, such that BJT 50 operates in the forward active mode. BJT 50 in the active mode allows a large current to flow across channel 44 between drain 38 and source 40, such that low resistance paths are created initially between collector 52 and base 54. This large current can also be used to extend the low resistance path to include emitter 56. Therefore, although a FET structure is being used, the device is relying on the BJT phenomena discussed above with relation to FIGS. 1A and 1B.

Specifically, antifuse 30 is programmed by closing switch 48, which closes the circuit between programming voltage Vpp and ground and allows current to flow from the higher voltage Vpp connected to drain 38, through channel 44 to source 40, and finally through closed switch 48 to ground. It should be noted that channel 44 is not being used in the FET sense. The gate 42 is shorted to the source 40 and therefore, no conducting channel is created as is normal in FET applications. Rather, programming voltage Vpp and auxiliary voltage Vb are applied such that BJT 50 is operated in the forward active mode, meaning the junction between collector 52 and base 54 is reverse biased, and the junction between base 54 and emitter 56 is forward biased. Applying voltage Vb to body 36 adds additional carriers into base 54, which allows the programming voltage Vpp at which antifuse 30 is programmed to be lower than it would be without the application of voltage Vb to body 36. The combination of voltage Vb and programming voltage Vpp results in a large current flowing from collector 52, through base 54, and into emitter 56. The power generation associated with the current results in the fusing of collector 52 to base 54 and possibly emitter 56. By fusing collector 52 to base 54 and possibly emitter 56, a permanent low resistance path is formed between collector 52 and base 54 and possibly emitter 56.

Figure 4A:
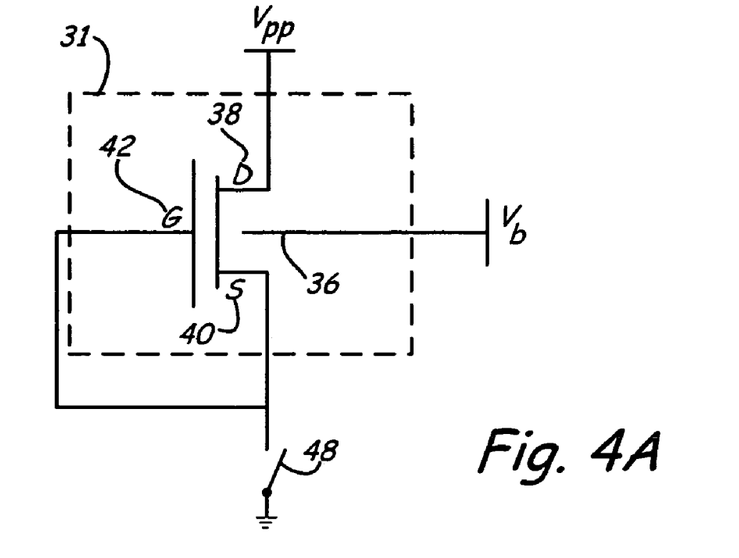
FIG. 4A is a schematic view of the antifuse device shown in FIG. 3, showing the connections of a Field Effect Transistor (FET) used to implement the antifuse device.

FIG. 4A is a schematic view of antifuse device 30, specifically illustrating how FET 31 is connected to outside terminals, described with reference to FIG. 3 above. As discussed above, and illustrated in FIG. 3, gate 42 is shorted to source 40, both of which are connected to ground through switch 48. As discussed above, in other embodiments gate 42 may be connected to a fixed potential lower potential of source 40, such that FET 31 is prevented from operating in the typical FET fashion. Likewise, in other embodiments source 40 is connected to a fixed potential, not necessarily ground. Drain 38 is connected to programming voltage Vpp, and body 36 is connected to voltage Vb. Because gate 42 is shorted to source 40, FET 31 for all intents and purposes will be turned off. Therefore, the operation of antifuse 30 is better understood with reference to the operation of parasitic lateral npn BJT 50, as shown in FIG. 4B.

Figure 4B:
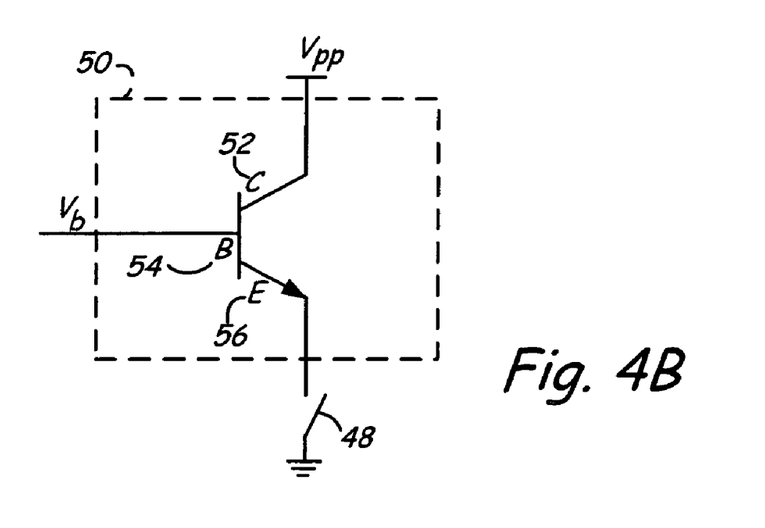
FIG. 4B is a schematic view of the antifuse device shown in FIG. 3, showing the connections of a Bipolar Junction Transistor (BJT) inherent in the FET.

FIG. 4B is a schematic view of antifuse 30 with emphasis on the connections and operation of BJT 50, described with reference to FIG. 3 above. The detailed operation of BJT 50 is as described above with reference to BJT 12 of FIGS. 1A and 1B. Collector 52 is connected to programming voltage Vpp, base 54 is connected to voltage Vb, and emitter 56 is connected through switch 48 to ground. To program antifuse 30, switch 48 is closed, creating a large voltage difference between collector 52 and emitter 56. A large programming voltage Vpp applied to collector 52 will cause the second breakdown effect in BJT 50. This large increase in carriers results in an increase in current flowing from collector 52 to emitter 56. To decrease the programming voltage Vpp required to cause avalanching, voltage Vb is simultaneously applied to base 54. Voltage Vb lowers the programming voltage Vpp required for first breakdown. After first breakdown, BJT 50 enters snapback mode. Once BJT 50 enters snapback mode, a sufficiently high programming current will enable a second breakdown. During second breakdown, current between collector 52 and emitter 56, though base 54, increases. The amount of energy generated in channel 44 by the large current results in the initial fusing together of collector 52 and base 54, and thereafter possibly fusing together of collector 52, base 54 and emitter 56, creating a low resistance path in each case.

As stated above, this destructive phenomenon is avoided in the typical operation of BJT's, including BJT's found inherently within FET's. The present invention makes use of this destructive phenomenon to create an easily programmable antifuse device by taking advantage of the normally high resistive path inherent to reverse biased junctions in BJTs and the ability to convert this to a low resistance path with a relatively small amount of voltage. By applying voltage Vb to base 54 during this operation, the programming voltage Vpp required to place BJT 50 into snapback mode is greatly reduced. This concept was also illustrated in FIG. 2, and applies in the same manner to the exemplary embodiments shown in FIGS. 3, 4A, and 4B. As shown in FIG. 2, by applying a voltage to the base of a BJT (voltage Vb), the programming voltage (Vpp) required to place the BJT into snapback is greatly reduced.

Figure 5A:
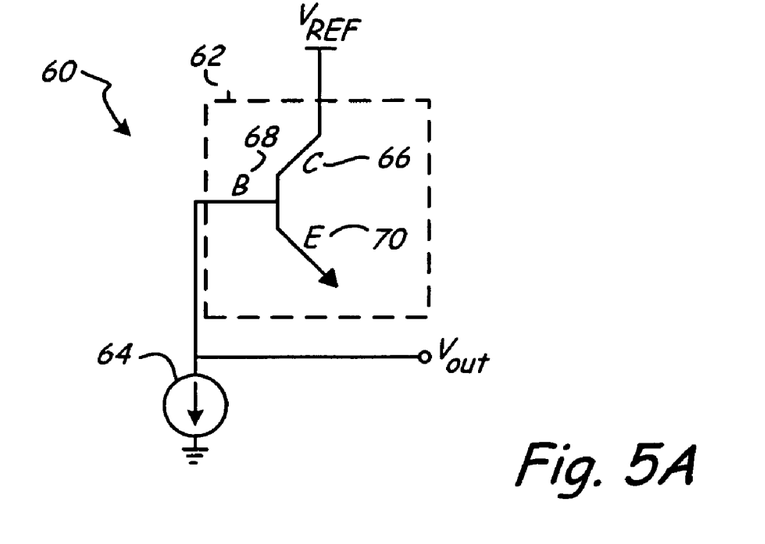
FIG. 5A is a schematic view of one embodiment of a read circuit used to detect the state of the antifuse device.

FIG. 5A is a schematic diagram of an exemplary read circuit 60 used to detect the state of antifuse device 62. Antifuse 62 is illustrated for the sake of simplicity as a simple BJT including collector 66, base 68 and emitter 70. Collector 66 is connected to reference voltage Vref, base 68 is connected to current source 71 and to output node Vout, and emitter 70 is left open or unconnected. In the unprogrammed state, the junction between collector 66 and base 68 is reverse biased and thus high resistance. Application of reference voltage Vref to collector 66 and current source 71 to base 68 results in a large voltage drop across the high impedance base-collector junction. This results in output node Vout being pulled toward ground and read circuit 60 determines antifuse 62 is unprogrammed. In the programmed state, a low resistance path (shown in FIGS. 1A, 1B) exists between collector 66 and base 68. Because the base-collector junction has a low impedance, reference voltage Vref only experiences a small voltage drop across the base-collector junction depending on the resistance value of programmed antifuse 62 (depending on variables discussed with respect to FIGS. 1A, 1B) and the magnitude of current source 76, resulting in a higher voltage level being seen by output node Vout. In this manner, read circuit 60 determines the state (programmed or unprogrammed) of antifuse 62. Read circuit 60 could thus be used to read one bit of information stored by antifuse 62. A person of skill in the art would recognize that an array of antifuse devices 62 could be used to create a memory array. Read circuit 60 could also be adapted to allow reading of a number of antifuse device 62 arranged as an array.

Figure 5B:
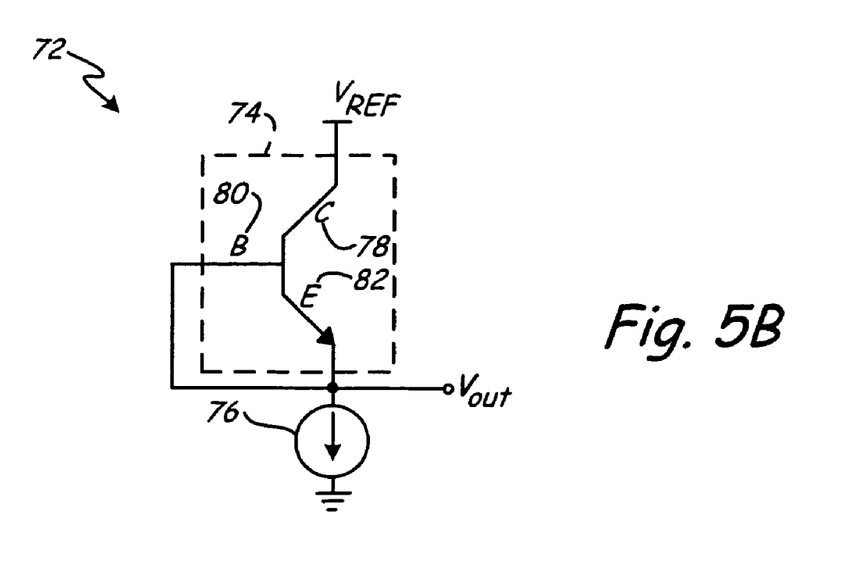
FIG. 5B is a schematic view of one embodiment of a read circuit used to detect the state of the antifuse device.

FIG. 5B is a schematic diagram of an exemplary read circuit 72 used to detect the state of antifuse device 74. Antifuse 74 is illustrated for the sake of simplicity as a simple BJT including collector 78, base 80 and emitter 82. Collector 78 is connected to reference voltage Vref, base 80 is connected to emitter 82, and emitter 82 is connected to current source 83 and output node Vout. A person of ordinary skill in the art would recognize that base 82 may be connected to some other potential than emitter 82 such that insignificant collector 78 to emitter 80 current flows in the BJT. In the unprogrammed state, the path between collector 78 and emitter 82 has a high resistance. Applying reference voltage Vref to collector 78 and current source 83 to emitter 82 results in a large voltage drop across the high resistance path between collector 78 and emitter 82 junction. This results in output node Vout being pulled toward ground and read circuit 72 determines antifuse 74 is unprogrammed. In the programmed state, a first low resistance path (shown in FIG. 1A) exists between collector 78 and base 80, and the emitter-base junction has been shorted out. Because the base-collector junction has a low resistance (as shown in FIG. 1A), reference voltage Vref only experiences a small voltage drop across the base-collector junction depending on the resistance value of programmed antifuse 74 (depending on variables discussed with respect to FIGS. 1A, 1B) and the magnitude of current source 76 resulting in a higher voltage level being seen by output node Vout. In this manner, read circuit 72 determines the state, programmed or unprogrammed, of antifuse 74.

In another embodiment, a low resistance path is created between collector 78, base 80 and emitter 82 (as shown in FIG. 1B). Because a low resistance path exists between collector 78 and emitter 82 (as shown in FIG. 1B), reference voltage Vref only experiences a small voltage drop between collector 78 and emitter 82 depending on the resistance value of programmed antifuse 74 (as a result of variables discussed with respect to FIGS. 1A, 1B) resulting in a higher voltage level being seen by output node Vout. In this manner, read circuit 72 determines the state (programmed or unprogrammed) of antifuse 74. Read circuit 72 could thus be used to read one bit of information stored by antifuse 74. A person of skill in the art would recognize that an array of antifuse devices 74 could be used to create a memory array. Read circuit 72 could also be adapted to allow reading of a number of antifuse device 74 arranged as an array.

An antifuse device has been described that takes advantage of the initially high resistance paths found in bipolar junction devices, and the physical characteristics of the bipolar junction device that allow the conversion of the high resistance path into a low resistance path. By manipulating the base terminal of the bipolar junction device, the programming voltage required to create the low resistance path is reduced.

Although the present invention has been described with reference to preferred embodiments, workers skilled in the art will recognize that changes may be made in form and detail without departing from the spirit and scope of the invention.

The invention claimed is:

1. An antifuse device comprising:
   a bipolar junction transistor (BJT) comprising:
      a collector;
      a base; and
      an emitter, wherein a high resistance path exists between the collector and the base;
   a first input voltage connected to the collector;
   a second input voltage connected to the base; and
   a switch connected to connect the emitter to a first fixed potential when closed, wherein the antifuse device is programmed by closing the switch, allowing the first input voltage and the second input voltage to create a current from the collector to the emitter, aided by current from the base, through the base, wherein the current converts the high resistance path between the collector and the base to a permanent low resistance path.

2. The antifuse device of claim 1, wherein the BJT is a npn-type BJT.

3. The antifuse device of claim 1, wherein the first input voltage is between 5 and 10 volts.

4. The antifuse device of claim 1, wherein the second input voltage is less than or equal to the first input voltage.

5. The antifuse device of claim 1, wherein the permanent low resistance path between the collector and the base has a resistance value between 50 and 1000 ohms.

6. The antifuse device of claim 1, wherein the high resistance path exists between the collector and the emitter, wherein the antifuse device is programmed by closing the switch, allowing the first input voltage and the second input voltage to create the current from the collector to the emitter, through the base, wherein the current converts the high resistance path to a permanent low resistance path.

7. The antifuse device of claim 6, wherein the permanent low resistance path between the collector and the emitter has a resistance value between 50 and 1000 ohms.

8. The antifuse device of claim 6, wherein the BJT is located within a field effect transistor (FET), the FET comprising:
   a body;
   a first doped region diffused into the body region;
   a second doped region diffused into the body region;
   a gate deposited over the body between the first doped region and the second doped region, wherein the gate is maintained at a second fixed potential; and
   wherein the collector of the BJT is realized by the first doped region, the emitter of the BJT is realized by the second doped region, and the base of the BJT is realized by the body region.

9. The antifuse device of claim 8, wherein the FET is a n-type FET.

10. A method of programming an antifuse device employing a bipolar junction transistor (BJT) having a base, a collector, and an emitter, the method comprising:
   applying a base voltage to the base of the BJT;
   applying a programming voltage to the collector of the BJT;
   closing a switch connecting the emitter of the BJT to a fixed potential such that a current path is created from the programming voltage, through the collector and the base to the emitter, and through the switch to the fixed potential, allowing a current to flow; and
   opening the switch after the current has fused the collector and the base such that a permanent low resistance path is created between the collector and the base.

11. The method of claim 10, wherein the switch is closed for about 20 microseconds.

12. The method of claim 10, wherein the programming voltage applied to the collector of the BJT is between 5 and 10 volts.

13. The method of claim 10, wherein the base voltage is equal to or less than the programming voltage.

14. The method of claim 10, wherein the permanent low resistance path has a resistance of between 50 and 1000 ohms.

15. The method of claim 10, wherein the switch is opened after the current has fused the collector and the base such that a permanent low resistance path is created between the collector and the base and after the current has also fused the collector, the base and the emitter such that the permanent low resistance path is created between the collector, the base and the emitter.

16. The method of claim 15, wherein the permanent low resistance path has a resistance value between 50 and 1000 ohms.

17. The method of claim 15, wherein the switch is closed for about 20 microseconds.

18. A method of programming an antifuse device employing a field effect transistor (FET) having a source, a drain, a gate, and a body, the method comprising:
- applying a body voltage to the body of the FET;
- applying a programming voltage to the drain of the FET;
- closing a switch connecting the source of the FET to a fixed potential such that a current path is created from the programming voltage, through the drain, the body, the source, and the switch to the fixed potential, allowing a current to flow; and
- opening the switch after the current has fused the drain and the body such that a permanent low resistance path is created between the drain and the body.

19. The method of claim 18, wherein the switch is opened after the current has fused the drain and the body such that a permanent low resistance path is created between the drain and the body and after the current has also fused the drain, the body, and the source such that the permanent low resistance path is created between the drain, the body and the source.

* * * * *